United States Patent [19]
Reed et al.

[11] 3,798,060
[45] Mar. 19, 1974

[54] METHODS FOR FABRICATING CERAMIC CIRCUIT BOARDS WITH CONDUCTIVE THROUGH HOLES

[75] Inventors: Wallace D. Reed; Richard A. Stoltz, both of Monroeville, Pa.

[73] Assignee: Westinghouse Electric Corporation, Pittsburgh, Pa.

[22] Filed: Oct. 28, 1971

[21] Appl. No.: 193,461

[52] U.S. Cl. ...... 117/212, 117/107.2 R, 117/130 E, 117/217, 156/8, 156/18, 204/23
[51] Int. Cl. ......................... C23c 11/02, C23c 3/00
[58] Field of Search .................. 156/3, 17, 18, 7, 8; 117/107.2, 212, 217, 201, 130 E; 204/14 R, 15, 23; 317/258, 261

[56] References Cited

UNITED STATES PATENTS

| | | | |
|---|---|---|---|
| 3,669,724 | 6/1972 | Brand | 117/107.2 |
| 3,543,386 | 12/1970 | Inoue et al. | 117/107.2 |
| 3,698,940 | 10/1972 | Mersereau et al. | 117/212 |
| 3,529,350 | 9/1970 | Rairden | 117/212 |
| 3,697,343 | 10/1972 | Cuomo et al. | 117/212 |

*Primary Examiner*—Ralph S. Kendall
*Assistant Examiner*—J. Massie
*Attorney, Agent, or Firm*—R. A. Stoltz

[57] ABSTRACT

A method for preparing double-sided circuit boards for electrical circuits wherein a ceramic substrate containing a plurality of holes is metallized by chemical vapor deposition of tungsten on the surface and through the holes and is etched delineate conductive patterns. There is also provided the product produced by this process. The process is preferably used on electronic microcircuits with alumina or beryllia substrates where electrical interconnections between conductive patterns the two outer surfaces and between the outer surfaces and the innerlayers are provided by through-hole metallization.

6 Claims, 3 Drawing Figures

METHODS FOR FABRICATING CERAMIC CIRCUIT BOARDS WITH CONDUCTIVE THROUGH HOLES

BACKGROUND OF THE INVENTION

The present invention relates to the art of the fabrication of electrical circuitry and has particular reference to circuit boards for hybrid microelectronics.

As is well-known in the art, circuit boards are generally made by either epoxy-glass printed circuit board techniques, thick film techniques, or thin film techniques. The epoxy-glass printed circuit board techniques have been widely used in the electronic industry.

A higher degree of miniaturization thin epoxy-galss printed circuit boards is provided by the hybrid microelectronics, such as the well-known thick film and thin film techniques. In the thick film techniques a paste is generally applied to a ceramic substrate through a patterned screen and subsequently fired to form a cement. In the thin film techniques the ceramic substrate is generally metallized by vacuum deposition and subsequently patterned with resist and etched back to provide the conductor pattern.

Circuit boards produced by all three techniques have been fabricated in both single-sided and double-sided (conductors on both top and bottom) configurations. Double-sided board with conductors contained in innerlayers are used on epoxy-glass printed circuit boards, but only single-sided boards are generally used when innerlayers are used in hybrid microelectronics, due to the difficulties in reliable through-hole metallizing. The use of the method of this invention makes double-sided boards with innerlayers practical in a highly miniaturized circuit.

In the copper-clad epoxy-glass printed circuit board the metallization through the holes is provided initially by a relatively thin coating of copper by electroless deposition followed by a thicker film of copper which is electroplated over the electroless copper. Conductive through-holes in thick film technology are generally provided by drawing paste into the holes by means of the vacuum applied to the side of substrate opposite that on which the paste is being screened, thereby partially filling the hole with the paste (which becomes conductive when subsequently fired). Conductive through-holes on thin film technology are generally produced by providing relative motion between the source of metal being deposited and the substrate in such a manner that each portion of the interior surface of the holes is successively exposed, in a line sight manner, to the source.

All three of the generally used methods of the prior art have limitations as compared to the instant invention. The copper clad epoxy-glass printed circuit board is relatively large and has temperature and stability limitations due to the use of organic materials. The thick-film technique gives a somewhat unpredictable coating in the holes, presents inspection difficulties, gives unreliable electrical connection to innerlayers and, because at least some of the holes are usually almost completely filled, generally precludes the insertion of pins in conductive through-holes. The thin film technique generally results in marginal adhesion between the metallization and the ceramic, and in unreliable contact to innerlayers due to shadowing and lack of penetration by the vacuum deposited conductor material and is also generally relatively costly.

SUMMARY OF THE INVENTION

Briefly, the present invention provides a method of preparing double-sided circuit boards with metallized through-holes in a ceramic substrate. The metallized conductor pattern and metallization through the holes is accomplished by; heating a ceramic substrate containing a plurality of holes to a predetermined temperature of at least 450°C, introducing into contact with the substrate and into the holes of the substrate a gas comprising hydrogen and tungsten halide which upon contact with the heated substrate causes the tungsten halide to react with the hydrogen and coat tungsten metal onto the substrate, cooling the substrate in non-oxidizing atmosphere, patterning the cooled substrate with an etch resistant material in a pattern which delineates a predetermined conductor pattern, and etching the substrate.

BRIEF DESCRIPTION OF THE DRAWINGS

A better understanding of the invention will be obtained by the exemplary embodiment shown in the accompanying drawings, wherein.

DESCRIPTION OF PREFERRED EMBODIMENTS

While the present invention can be used with equal advantage in electrical circuitry of the size of the well-known circuit boards, it is especially adapted for use with circuits about the size of hybrid microcircuits and accordingly will be so described.

Figure 1:
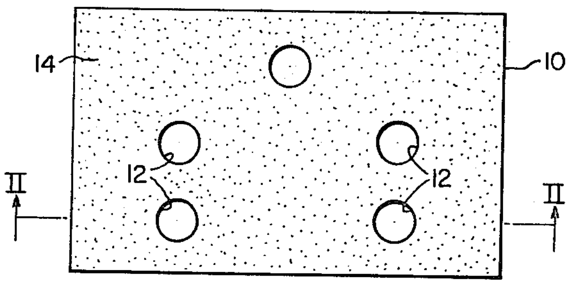
FIG. 1 is a top view of a coated ceramic substrate containing a plurality of holes, the periphery of the holes having been coated with tungsten by chemical vapor deposition.

With reference to FIG. 1 there is shown a coated substrate 10 which contains a plurality of metallized through-holes 12.

Figure 2:
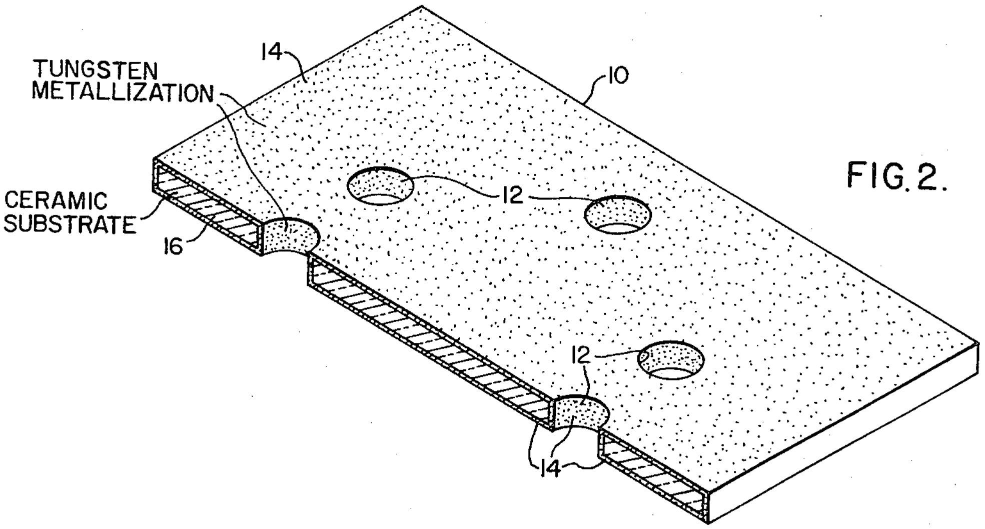
FIG. 2 is a fragmentary perspective view of a portion of the coated substrate showing the metallization on the periphery of the holes.

With reference to FIG. 2 portions of the coated substrate 10 are shown in more detail, especially the relationship of tungsten metallization 14 and the ceramic substrate 16.

Figure 3:
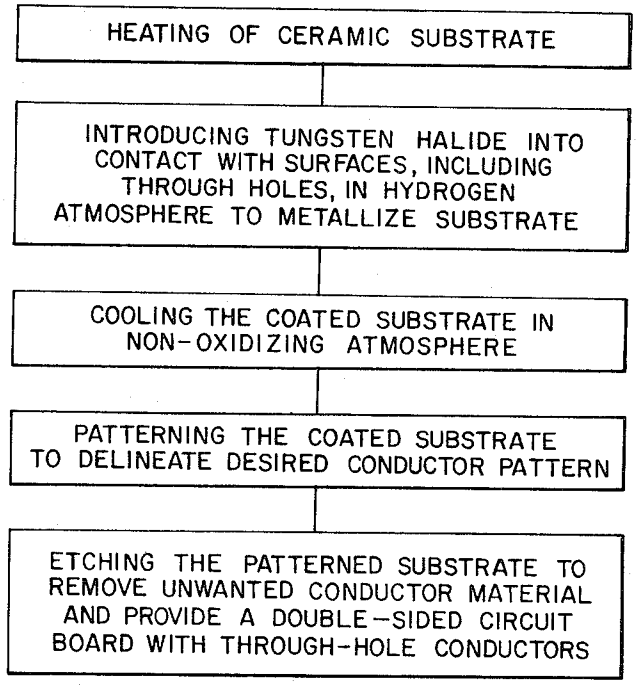
FIG. 3 is a flow chart illustrating the steps of the method used to prepare a double-sided circuit board with metallized through-holes.

FIG. 3 shows a flow chart of the typical steps in the production of a double-sided circuit board with metallized through-holes. The first step is the heating of the ceramic substrate to a predetermined temperature between 450° and 1,200°C. Gas comprising hydrogen and tungsten halide is introduced into contact with the heated substrate such that the halide-hydrogen reaction will coat the surfaces, including the periphery of the holes, with metallic tungsten. When tungsten hexacloride or tungsten pentabromide is used the halide must be heated to maintain the halide in gaseous form, but tungsten hexafluoride can be maintained as a gas at room temperature. In addition to producing metallic tungsten, the reaction produces a hydrogen-halogen compound which acts to clean the surface of the ceramic substrate 16 during the deposition. The HF produced by the tungsten hexachloride, hydrogen reaction, for example, provides a slight etch of the ceramic substrate 16 and this etch improves the adhesion of tungsten to the ceramic.

After coating, the substrate is cooled in a non-oxidizing atmosphere. The coated substrate is preferably cooled to less than 200°C to prevent the oxidization of the tungsten metallization 14.

The coated substrate is next patterned, typically both top and bottom, to delineate the desired conductor patterns. This may be with a screened pattern of resist material or a photoresist material which is applied in an unpatterned fashion and then patterned by exposing the photoresist with a predetermined pattern of light and developing the photoresist. The photoresist may be either a resist which is applied as a liquid, or as a dry film, both of which are also known in the art. The dry film resist has the advantage of "tenting" or spanning across the holes and when the holes are to be protected during subsequent processing steps the use of a dry film eliminates the problems of coating the insides of holes with photoresist and of exposing photoresist inside of the holes.

The pattern substrate is etched to remove unwanted conductor material but conductor material in the desired configurations, including through the holes, is protected from the etchant by the pattern of resist, and this metal remains. Thus a double-sided circuit board with through-holes conductors is provided.

Although it is possible to produce double-sided circuit boards with through-holes conductors directly from the tungsten metallization 14, the tungsten is a relatively difficult material with which to make electrical junctions. It is therefore preferable to plate other metals on top of the tungsten. This can be done either before patterning, partly before and partly after patterning, or completely after patterning. Gold is desirable for ease of wire bonding and for protection of the underlining conductor material. If gold is used it is preferable to apply to the gold after patterning and avoid the difficulties of etching gold. It is also preferable to provide an additional metal, such as nickel which can be conveniently soldered. Preferably nickel is electroplated over the tungsten and gold is plated over the nickel.

The following specific example describes in greater detail various combinations which are possible using this method.

EXAMPLE I

A 94 percent $Al_2O_3$ substrate containing a plurality of holes is predetermined heated to 500°C. The substrate is placed in an atmosphere containing three parts of $H_2$ to one part of tungsten hexafluoride for approximately 20 minutes at a pressure of one atmosphere. The substrate is allowed to cool in a $H_2$ atmosphere to approximately 100°C. The substrate is removed from the atmosphere and allowed to cool to room temperature. Etch resist is then screen printed in an appropriate pattern on both sides of the substrate. The exposed tungsten is etched away in approximately one minute in a solution which contains 5 parts $HNO_3$, one part HF and one part acetic acid.

EXAMPLE II

A circuit board can be produced on a beryllia substrate in a similar manner to that described in Example I.

EXAMPLE III

A circuit board with a 99 percent alumina substrate can be produced as follows: heating the substrate to 1,200°C, inserting the substrate into an atmosphere which consists of 5 parts $H_2$ to 1 part tungsten hexachloride and which is heated to 150°C and which is at a pressure of 10 torrs, cooling the substrate to 200°C before removing it from the atmosphere, cooling the substrate to room temperature then coating with liquid photoresist which is then allowed to dry exposing and developing the photoresist, electroplating the exposed tungsten with 0.3 mil of nickel, electroplating 0.1 mil of gold over the nickel, stripping the photoresist by heating the coated and plated substrate to 400°C, and then cooling and etching the unplated portions of tungsten in an aqueous solution which consists of one part $H_2O_2$ to one part of saturated solution of sodium hydroxide in water. Potassium hydroxide can be used to partly, or completely, replace the sodium hydroxide.

EXAMPLE IV

A multilayer circuit board, using a 96 percent alumina substrate, inside which is contained an innerlayer of patterned conductive material, can be prepared as follows: the substrate is heated to 450°C in an atmosphere consisting of 15 parts of $H_2$ to 1 part of tungsten hexafluoride at 5 atmospheres pressure, the substrate is cooled to 50°C in a non-oxidizing atmosphere, 0.5 mil of nickel is electroplated over the tungsten, dry film photoresist is applied to the top and bottom surfaces of the substrate in such manner that it tents over the holes, the photoresist is exposed with an appropriate pattern and developed, the exposed nickel (and as it becomes exposed, the tungsten) is etched away with a one to one HF nitric acid mixture, and then a protective layer of gold is added by immersing the substrate in a replacement (immersion) gold solution for approximately 1 minute.

The circuit boards produced by this method have an extremely strong bond of tungsten to ceramic on the surface of the substrate and through the holes.

It is also possible to use somewhat weaker ceramics, such as fosterites or steatites, but it is preferable to use the stronger beryllia or alumina substrates.

The innerlayers are, of course, put in the substrate during fabrication on the substrate and their conductive pattern is determined at that time. Using a double-sided substrate with innerlayers provides great flexibility in circuit layout and high circuit density as two surfaces can be patterned during final board fabrication and connected via the through-holes to provide cross-overs. In addition, large wiring nets, such as voltage distributions, can be provided using the innerlayers.

We claim:

1. The method of preparing double-sided circuit boards, with metallized through-holes, for electrical circuits, which method comprises:

a. heating a ceramic substrate containing a plurality of holes, to a predetermined temperature between 450°–1,200°C, b. introducing into contact with said substrate and into said holes in said substrate, a gas comprising hydrogen and tungsten halide which upon contact with said heated substrate will cause said tungsten halide to react with said hydrogen to coat the tungsten constituent of said tungsten halide onto said substrate as metallic tungsten;

c. cooling said coated substrate in a non-oxidizing atmosphere;

d. patterning said coated substrate with etch resistant material in a pattern which delineates a predetermined conductor pattern; and e. etching said coated and patterned substrate.

2. The method as specified in claim 1, wherein said ceramic comprises beryllia and said tungsten halide consists essentially of at least one of $WCl_6$ and $WF_6$.

3. The method as specified in claim 1, wherein said ceramic comprises alumina and said tungsten halide consists essentially of at least one $WCl_6$ and $WF_6$.

4. The method as specified in claim 3, wherein:

a. said patterning comprises; coating said substrate with photoresist, exposing said photoresist with a predetermined pattern of light, and developing said photoresist and thereby exposing some portions of said tungsten;

b. before etching said coated and patterned substrate, electroplating a predetermined thickness of nickel and then a predetermined thickness of gold onto said exposed portions of said tungsten; and c. after electroplating but before etching, removing said photoresist such that tungsten which is not covered by nickel and gold may be etched away in the subsequent etching step, d. said etching is done with a solution of $H_2O_2$ and an approximately equal proportion of at least one of KOH and NaOH.

5. The method as specified in claim 3, wherein:

a. prior to patterning said coated substrate, electroplating said substrate with a predetermined thickness of nickel;

b. said patterning comprises coating said substrate with a dry film photoresist, exposing said photoresist with a predetermined pattern of light, and developing said photoresist and thereby exposing some portions of said electroplated nickel during the subsequent etching step; and c. after etching, immersing said substrate into replacement gold solution and thereby coating said nickel with gold.

6. The method as specified in claim 1, where said ceramic contains an innerlayer of patterned conductive material and said tungsten through-hole metallization is used to provide electrical connections between said conductive innerlayers and surface conductors delineated by etching.

* * * * *